United States Patent [19]
Brill et al.

[11] 4,099,663
[45] Apr. 14, 1978

[54] SEVERING WIRE OR RIBBON MATERIAL ADJACENT AN ATTACHMENT POINT, SUCH AS A SOLDER, BOND OR WELD CONNECTION, PARTICULARLY IN SEMICONDUCTOR AND THIN FILM STRUCTURES

[75] Inventors: Klaus Brill, Korntal; Günter Schmid, Stuttgart, both of Germany

[73] Assignee: Robert Bosch GmbH, Stuttgart, Germany

[21] Appl. No.: 776,737

[22] Filed: Mar. 11, 1977

[30] Foreign Application Priority Data

Apr. 14, 1976 [DE] Fed. Rep. of Germany ....... 2616521

[51] Int. Cl.² ............................................. B23K 31/02
[52] U.S. Cl. ....................................... 228/159; 29/628; 228/4.5; 228/13; 228/904
[58] Field of Search .................. 228/159, 904, 4.5, 13; 29/628; 83/3 R

[56] References Cited

U.S. PATENT DOCUMENTS

| | | | |
|---|---|---|---|
| 3,747,198 | 7/1973 | Benson | 228/159 X |
| 3,999,451 | 12/1976 | Ogle | 81/3 R |

*Primary Examiner*—Donald G. Kelly
*Attorney, Agent, or Firm*—Flynn & Frishauf

[57] ABSTRACT

The wire, ribbon, or the like, is repetitively bent back and forth until it breaks, the bending being, preferably, effected rapidly, for example by means of an electromagnet fed, for example, with line frequency alternating current. The wire is guided in a guide tool which deflects the wire transversely to its axis rapidly back and forth, thus effecting breaking within about one second of application of bending stresses. This is particularly useful to sever tiny wires, in the order of 100 μm diameter, as connecting leads in semiconductor and thin film technology.

15 Claims, 1 Drawing Figure

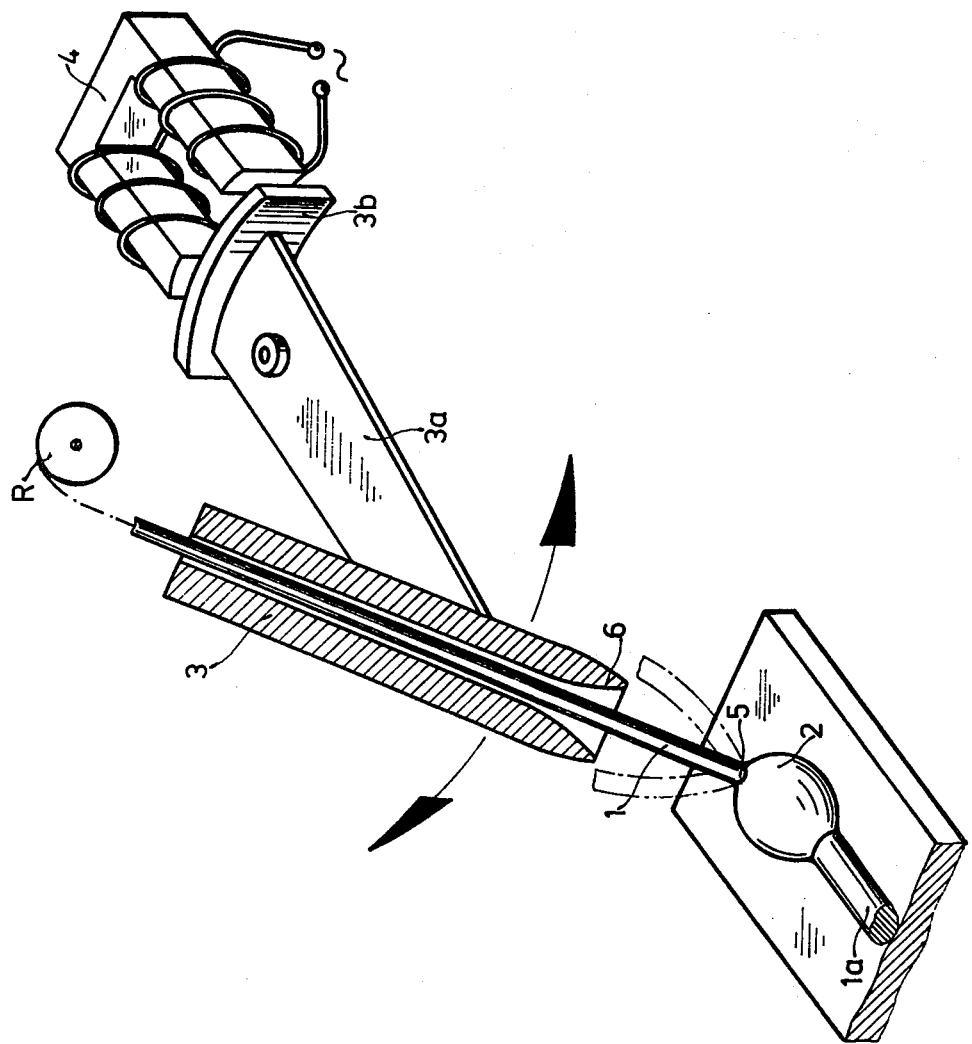

SEVERING WIRE OR RIBBON MATERIAL ADJACENT AN ATTACHMENT POINT, SUCH AS A SOLDER, BOND OR WELD CONNECTION, PARTICULARLY IN SEMICONDUCTOR AND THIN FILM STRUCTURES

The present invention relates to a method and apparatus to sever a wire, ribbon, tape, or the like, adjacent an attachment point, such as a solder, bond or weld connection to a substrate.

The material to be severed, generally, is elongated filamentary material and may be a wire of round or other cross section; a ribbon, tape, or other type of elongated material, hereinafter collectively referred to as "strand" to avoid repetitious language.

To sever strands, it has previously been proposed to first notch the strand and then tear it adjacent an attachment point. The structure as well as the positioning of such a severing arrangement is difficult to use, particularly when the dimensions of the strands are small, and when the space where they can be applied is small. The severing apparatus must frequently be separately positioned, apart from positioning of the strand, requiring additional labor to apply the severing apparatus, and hence requiring further time during manufacturing of the article including the strand to be severed. This apparatus further does not usually result in, or permit, severance of the strand immediately adjacent the attachment point, but rather leaving at least a short stub projecting from the attachment point.

It is an object of the present invention to provide a rapid and reliable method and apparatus to sever a strand adjacent an attachment point; the attachment point may be a weld, bond, or solder connection, or a clamping point. The method should be particularly applicable in situations in which there is little space for a severing apparatus, for example when severing strands at solder or bonding or welding positions connecting lead wires to connecting points in semiconductor manufacture, or in thin film technology. The method should, additionally, preferably provide for feeding and then severance of the strand immediately adjacent the clamping or other attachment point.

Subject matter of the present invention: Briefly, the strand, being a wire, tape, ribbon, or the like, is broken by repeated deflection and hence by applying bending stresses thereon until the strand breaks. Bending stresses are applied leading to breakage. Preferably, the strand is guided to the attachment point through a guide which can, after attachment, be subjected to repeated back-and-forth movement, to effect bending of the wire; the movement may, however, also be rotary and may be derived, for example, from a small electric motor connected to an eccenter or by means of a flexible shaft. In a preferred form, a guide element is provided coupled to an electromagnet which is energized with alternating current to oscillate the electromagnet in a direction approximately perpendicular to the axis of the strand.

In accordance with a preferred embodiment, a strand is severed immediately adjacent a soldering, bonding or welding point by guiding the strand, with only little play, in a guide holder formed with an elongated guide opening therein through which the strand is carried. The guide holder is attached to a bending device, preferably an oscillation generator, physically oscillating the guide holder. In a preferred form, the guide holder is coupled to an oscillating armature of an a-c excited electromagnet. Excitation with power line frequency of 50 or 60 Hz has proved especially useful. Such an oscillation generator is simple, reliable and practically free of maintenance requirements. The operating reliability of the method can be increased further if the guide element is slightly flared outwardly at the exit point of the strand from the guide opening. The end of the wire is thus not excessively stressed at the exit opening of the guide so that the wire end which is left after breaking can be used directly for subsequent connection without danger of malfunction if the previously stressed wire is later subjected to severe shocks or vibration while in use.

Drawings: illustrating an example, in which the single FIGURE is a part sectional, part perspective, schematic view of the apparatus to sever a wire, with the housing therefor removed.

A wire 1, fed from a supply reel R and part of a semiconductor manufacturing process, is secured at a solder point 2 to a substrate. The wire connection 1a, forming a continuation of the wire 1, terminates at the solder point 2. The wire 1 is supplied, for example, from roll R. Shortly before its end, it is guided through a tubular guide 3. The opening in tubular guide 3 is just slightly larger than the diameter of the wire, so that the wire is guided therein with slight play or clearance. The opening 3 is connected to a holder 3a which, in turn, is secured to a pivotable armature 3b fitting against an electromagnet 4, the windings of which are connected to a source of alternating current.

The wire should break clean and close to the solder dot 2, and preferably immediately adjacent the solder connection. The break point is shown at 5. In the example, shown, the break point 5 is spaced by about 0.2 cm from the terminal end 6 of the guide 3. This distance can be freely selected depending on the available space to sever wire 1. The time to breakage of the wire as well as the deflection amplitude can be matched to the thickness and material of the wire, with a given frequency; the frequency of oscillation of the guide 3, as determined by the frequency of supply of the electromagnet can also be changed to fit particular requirements. The amplitude of deflection is determined by the operating voltage, the geometry of the electromagnet and particularly its air gap, and by the length of the holding arm 3a connecting armature 3b to the holder 3.

Operation, and method: Oscillations generated by magnet 4 by means of armature 3b are transferred through holder 3a to the guide 3. These oscillations, applied to the wire 1, will cause fracture of the wire immediately behind the solder attachment 2 due to metal fatigue. The wire is oscillated transversely to its major direction by repeated deflection of the guide 3; the attachment solder dot 2 holds the wire steady at one point; the repeated deflection of the wire with respect to the fixed point at the solder connection will therefore lead to fracture thereof and hence severing. Electromagnetic generation of the deflection can cause so many deflecting cycles of essentially equal excursion within a short period of time that the time period from starting of the operation to fracture can be small and matched to the timing of other operations in connection with the severing of the wire. The amplitude of oscillation, their frequency, the length of the wire between the end 6 and the fracture point, and possibly applied tension on the wire are further parameters which may be considered with respect to the particular material and thickness of the wire and to optimize the system and match it to the respective geometry and application. The various parameters can readily be determined by simple experimentation and can easily be optimized. The time from start of the operation of fracture can be decreased by increasing the amplitude of oscillation, or by increasing its frequency. The stress placed on the wire at the attachment point can be changed by changing the length of the wire since, therefore, the deflection angle will change. Increasing the deflection angle, that is, decreasing the length of the free end of the wire between the attachment point and the positive guidance through the central opening of the tubular holder 3 likewise decreases the time to fracture. Applying tension to the wire also influences the severing conditions.

It is not necessary to apply tension to the wire in order to cause it to break. The device was operated with excellent results, without placing additional tension on the wire 1.

The method as well as the apparatus were used with wires attached by a solder, weld or bond attachment 2 to a substrate used in thin film technology applications and in semiconductor technology applications; the bond 2 may be any suitable bond, such as soldering, welding, or bonding, for example by thermal compression, ultrasonic bonding, or soft soldering. In the technologies referred to, reliable severance of the wire after termination of the attachment step is desirable; the wire should be severed immediately behind the attachment bond 2.

Example: A tinned copper wire of 100 μm diameter was fed through holder 3 and then soldered to a substrate. After soldering at the attachment solder dot 2, the wire guide 3 was vibrated by magnet 4 in a direction perpendicular to the axis of the wire. The amplitude of oscillation was 1.5 mm. The frequency of oscillation was 100 Hz. The time of severance from starting of oscillation was about one second. The wire 1 broke immediately adjacent the solder dot 2; in many experiments, breakage always occurred immediately at the attachment point and not at the end 6 of the guide 3, or between the end 6 and the attachment point 2. It seems that this is due to the fixed clamping of the wire at the attachment point 2 where highest mechanical loading arises. A solder attachment additionally causes an increase in brittleness of wire by formation of an alloy, in the example by formation of a copper-tin alloy at least at the surface.

The wire 1 can be additionally protected and the guidance improved by outwardly flaring the exit opening, as seen in the FIGURE, to thereby further decrease stresses placed on the wire adjacent the exit end 6 of the guide 3. The elasticity of the guide system, and the slight clearance between the wire 1 and the guide tube 3 provide additional protection for the wire. The outward flare at the exit end of the guide tube 3 can be conical or rounded.

The method, and the apparatus to carry out the method, permit severing the wire at a predetermined fixed point, namely immediately adjacent the solder or bond attachment 2, without requiring positioning of an additional severing apparatus, for example and edge, a knife, or the like. The apparatus is simple, can be made very small, and is applicable for use crowded spaces; it is reliable and, itself, requires little operating space or power, and is particularly suitable for working with strands and materials which are used frequently in the minature field in connection with thin film technology or semiconductor technology.

The guide 3 is particularly useful for wires of a fraction of a millimeter diameter. It has the dual function of guiding the wire, typically so thin as to be hardly visible, to an attachment point and, after attachment to a substrate, additionally forming a simple and small severing tool.

I claim:

1. Method to attach a strand (1) such as by a solder, bond, or weld connection to a substrate and then to sever the strand (1) adjacent the attachment point (2) comprising the steps of
    guiding the strand to the attachment point (2);
    attaching the strand;
    subjecting the stand to repetitive bending stresses and continuing the bending stresses until the materials fails by moving the strand as guided, repetitively in a direction essentially perpendicular to the major axis of the strand.

2. Method according to claim 1, wherein the step of subjecting the strand to bending stresses comprises rhythmically vibrating the strand back and forth with essentially equal excursions.

3. Method according to claim 1, wherein the step of subjecting the strand to bending stresses comprises bending the strand by vibrating the strand at a frequency of at least 100 Hz.

4. Method according to claim 1 wherein the step of subjecting the strand to bending stresses comprises bending the strand by generating oscillations by an electromagnet excited by alternating current and applying the oscillations as bending movement to the strand to move the strand in a direction essentially perpendicularly to its axis at the frequency of said alternating current, or a multiple thereof.

5. Method according to claim 4, wherein the bending step comprises vibrating the strand at a frequency of at least 100 Hz, by moving the strand back and forth.

6. Wire guiding and severing apparatus to sever a strand (1) having a central axis adjacent an attachment point (2) such as a solder, bond or weld connection, comprising
    a guide element (3) having a body with an opening formed therein just slightly larger than the strand (1) to guide the strand with slight clearance above its axis;
    and a vibrating apparatus (4) coupled to the guide element (3) and vibrating the guide element in a direction essentially perpendicularly to the axis of the strand.

7. Apparatus according to claim 6, wherein the vibrating apparatus (4) comprises an electromagnet energized by alternating current;
    and the guide element comprises an oscillating armature (3) located in magnetically attracting position with respect to the electromagnet and mechnically coupled to said body.

8. Apparatus according to claim 6, wherein said body comprises a tubular holder (3).

9. Apparatus according to claim 6, wherein said body (3) is elongated and said opening extends essentially lengthwise thereof, at least one terminal end of the opening (6) being outwardly flared.

10. Apparatus according to claim 9, wherein the vibrating apparatus (4) comprises an electromagnet energized by alternating current;
    and the guide element comprises an oscillating armature (3) in magnetically attracting position with respect to the electromagnet and mechanically coupled to said body.

11. Method according to claim 1 to effect a bonding connection to a semiconductor, thin film, or the like, and forming said substrate; comprising first guiding the strand in a tubular guide (3) to the attachment point (2);

attaching the strand to the substrate by at least one of: soldering, bonding, welding; and then severing the strand by rythmically vibrating the guide (3) and hence the strand therein back and forth.

12. The method of claim 11, wherein the strand is a wire having a diameter of a fraction of a millimeter, for example in the order of about 1/10 mm.

13. Apparatus according to claim 6 for use in the manufacture of a bonding connection to a semiconductor, thin film, or the like, and forming a substrate, and wherein the body is essentially tubular and the opening therethrough has a diameter of a fraction of a millimeter.

14. Apparatus according to claim 7, wherein the frequency of the alternating current is power line frequency.

15. Apparatus according to claim 14, wherein the opening through the body has a diameter just slightly more than 1/10mm.

* * * * *

UNITED STATES PATENT AND TRADEMARK OFFICE
CERTIFICATE OF CORRECTION

PATENT NO. : 4,099,663
DATED : July 11, 1978
INVENTOR(S) : Klaus BRILL and Gunter SCHMID It is certified that error appears in the above-identified patent and that said Letters Patent are hereby corrected as shown below:

Column 4, line 14, change "stand" to -- strand --
line 15, change "materials" to -- material -- on Title Sheet, Item [45] change "April 14, 1978" to

-- July 11, 1978 --

Signed and Sealed this

Sixth Day of March 1979

[SEAL]

Attest:

RUTH C. MASON
Attesting Officer

DONALD W. BANNER
Commissioner of Patents and Trademarks